United States Patent
Lam et al.

(10) Patent No.: US 7,548,120 B2
(45) Date of Patent: Jun. 16, 2009

(54) FREQUENCY SWITCHING METHOD

(75) Inventors: Tin-Sing Lam, Rowland Heights, CA (US); Chao-Tung Yang, Hsinchu (TW); Heng-Chih Lin, Hsinchu (TW); Shou-Fang Chen, Hsinchu (TW); Sining Zhou, Irvine, CA (US)

(73) Assignee: MStar Semiconductor, Inc., Hsinchu (TW)

( * ) Notice: Subject to any disclaimer, the term of this patent is extended or adjusted under 35 U.S.C. 154(b) by 141 days.

(21) Appl. No.: 11/836,206

(22) Filed: Aug. 9, 2007

(65) Prior Publication Data

US 2008/0036506 A1 Feb. 14, 2008

Related U.S. Application Data

(60) Provisional application No. 60/821,828, filed on Aug. 9, 2006.

(51) Int. Cl.
*H03L 7/00* (2006.01)
(52) U.S. Cl. ............... 331/2; 331/46; 331/49; 331/179
(58) Field of Classification Search ............ 331/2, 331/46, 49, 179
See application file for complete search history.

(56) References Cited

U.S. PATENT DOCUMENTS 7,038,552 B2 * 5/2006 Brett et al. ............... 331/183

* cited by examiner

*Primary Examiner*—Arnold Kinkead
(74) *Attorney, Agent, or Firm*—Kirton & McConkie; Evan R. Witt

(57) ABSTRACT

A frequency switching method is used to make switching among a plurality of frequency signal sources each providing a specific frequency range covering multiple bands. The method includes steps of providing a target frequency data; selecting one of the frequency signal sources to output a first clock signal; generating a first frequency data according to the clock signal of the first frequency to compare with the target frequency data; outputting a second clock signal with the highest band of another one of the frequency signal sources possessing a frequency range higher than that of the selected frequency signal source when the target frequency data is greater than the first frequency data; and outputting the second clock signal with the lowest band of the selected frequency signal source when the target frequency data is smaller than the first frequency data.

18 Claims, 10 Drawing Sheets

FREQUENCY SWITCHING METHOD

CROSS REFERENCE TO RELATED PATENT APPLICATION

This application claims the benefit of Provisional Patent Application Ser. No. 60/821,828 filed Aug. 9, 2006.

FIELD OF THE INVENTION

The present invention relates to a frequency switching method and more particularly to a frequency switching method for use with a plurality of voltage controlled oscillators covering different frequency ranges.

BACKGROUND OF THE INVENTION

Electronic communication products such as those for wireless LAN (local area network), UWB (ultra wideband), mobile communication, entertainment, etc. require high communication qualities, high data transmission rates and diversified bands within each frequency range. As a transceiver commonly used in a communication system, the quality of RF (radio frequency) signals generated by a clock generator thereof is critical to its performance. Clock generators typically used in the RF field include self-excited variable-frequency oscillators, crystal oscillators and frequency synthesizers. A large tuning range is essential to the above-mentioned requirements for various applications.

A PLL (phase locked loop) circuit is commonly used in a frequency synthesizer of an electronic communication system to eliminate at least the frequency and phase shifts between a transmitting end and a receiving end caused by environmental factors. FIG. 1 schematically illustrates a typical PLL circuit 101, including a phase/frequency detector (PFD) 1010, a charge pump 1011, a loop filter 1012 and a voltage controlled oscillator (VCO) 1013. When the PLL circuit 101 performs phase lock according to a reference clock signal, the VCO 1013 outputs a feedback clock signal to the PFD 1010 while the PFD 1010 outputs an up/down counting signal according to a phase/frequency difference between the reference clock signal and the feedback clock signal. The up/down counting signal is then converted into a control voltage by the charge pump 1011 and the loop filter 1012 to be outputted to the VCO 1013, thereby locking the phase/frequency of the feedback clock signal with those of the reference clock signal.

As known to those skilled in the art, in an electronic communication system, a frequency synthesizer can be used to modulate a data signal that is afterwards demodulated to recover the data signal. Conventionally, a single VCO is used in the PLL circuit to obtain the feedback clock signal. However, for an electronic device requiring a large tuning range, multiple VCOs are utilized to output the feedback clock signal with different frequencies with a large tuning range.

Please refer to FIG. 2A showing a PLL circuit 201 with multiple VCOs, including a phase/frequency detector (PFD) 2010, a charge pump 2011, a loop filter 2012 and a plurality of voltage controlled oscillators (VCOs) 2013~2018. The VCOs 2013~2018 can be switched ON/OFF by enabling signals (not shown). Furthermore, each of the VCOs 2013~2018 covers a predetermined frequency range so that the VCOs 2013~2018 cover a large frequency range. For example, the VCO 2013 covers a frequency range of 950~1150 MHz; the VCO 2014 covers a frequency range of 1150~1350 MHz; the VCO 2015 covers a frequency range of 1350~1550 MHz; the VCO 2016 covers a frequency range of 1550~1750 MHz; the VCO 2017 covers a frequency range of 1750~1950 MHz; and the VCO 2018 covers a frequency range of 1950~2150 MHz. Therefore, the VCOs 2013~2018 can cover a large frequency range of 950~2150 MHz. FIG. 2B shows the frequency range of VCOs 2013~2018 covering 9 bands.

As the operating frequency of a VCO is not stable, calibration is required after the circuit is powered on to find the optimal point in a band, e.g. the center of each band. It is thus important to calibrate VCOs efficiently.

SUMMARY OF THE INVENTION

The present invention provides a frequency switching method for switching among a plurality of frequency signal sources in order to efficiently perform calibration. Each frequency signal source provides a specific frequency range and operates at multiple bands. The method includes steps of: providing a target frequency data; selecting one of the frequency signal sources to generate a first clock signal; generating a first frequency data according to the first clock signal to compare with the target frequency data; operating the selected frequency signal source at the lowest band thereof to generate a second clock signal when the target frequency data is smaller than the first frequency data; and switching to another one of the frequency signal sources possessing a frequency range higher than that of the selected frequency signal source and operating at the highest band thereof to generate the second clock signal when the target frequency data is greater than the first frequency data.

The present invention also provides a frequency switching method, which includes steps of: providing a target frequency data; selecting one of the frequency signal sources to generate a first clock signal; generating a first frequency data according to the first clock signal to compare with the target frequency data; operating the selected frequency signal source at the highest band thereof to generate a second clock signal when the target frequency data is greater than the first frequency data; and switching to another one of the frequency signal sources possessing a frequency range lower than that of the selected frequency signal source and operating at the lowest band thereof to generate the second clock signal when the target frequency data is smaller than the first frequency data.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
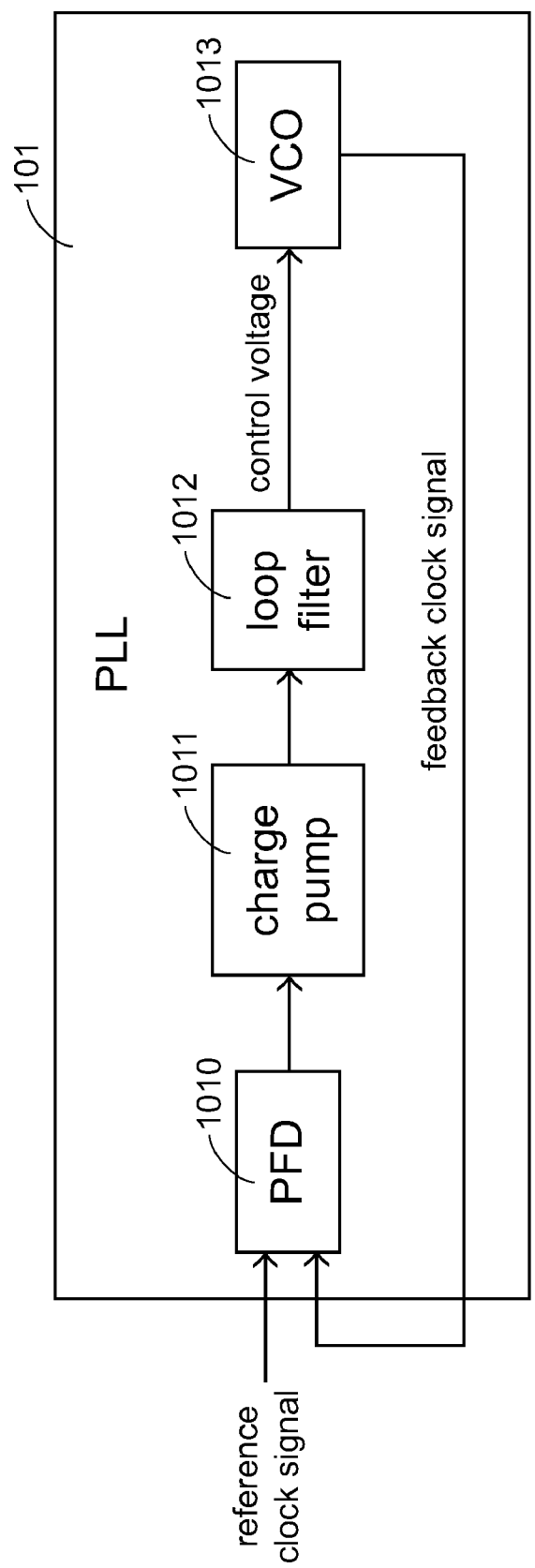
FIG. 1 is a block diagram of a conventional phase-locked loop circuit.
Figure 2A:
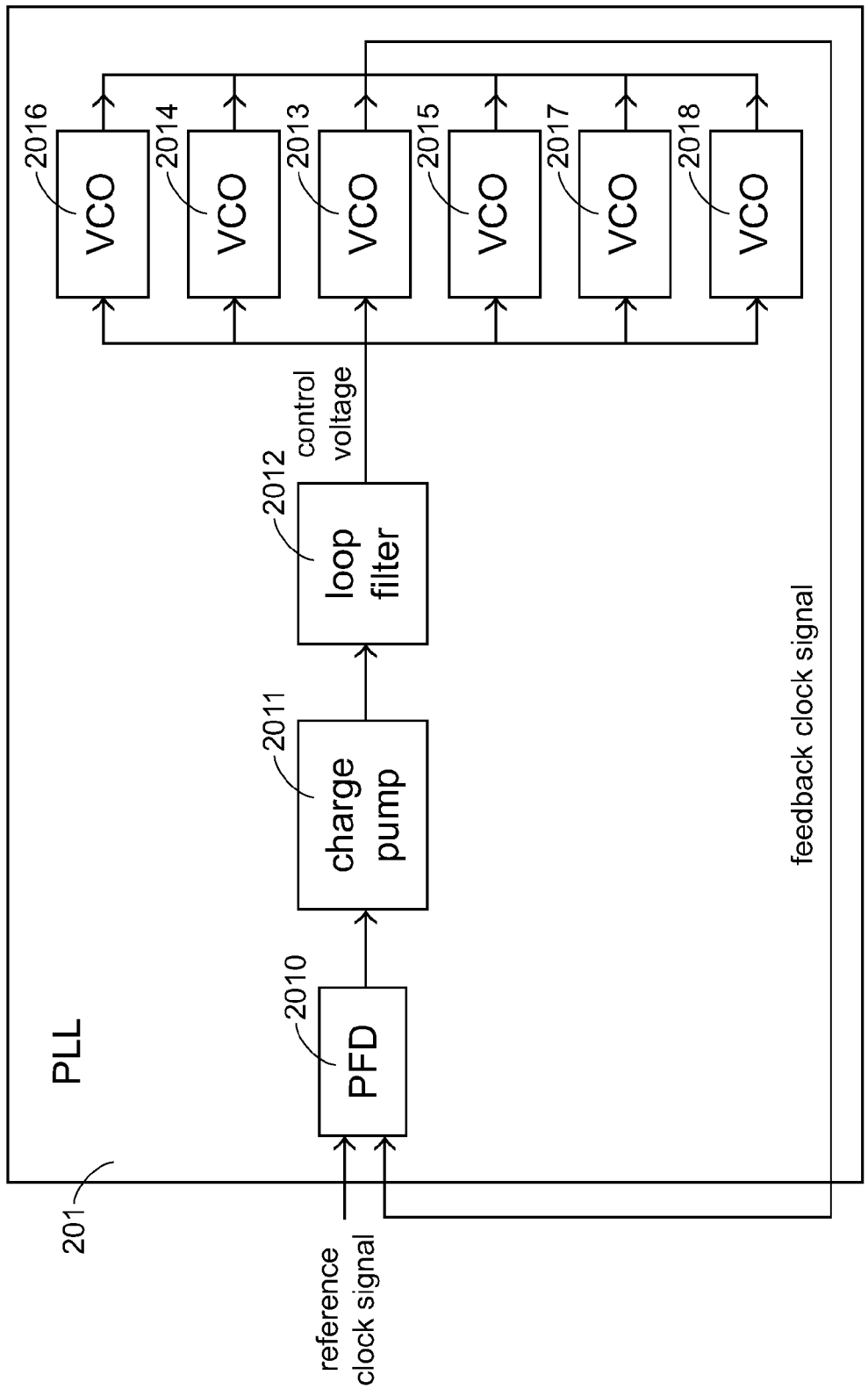
FIG. 2A is a block diagram of another phase-locked loop circuit.
Figure 2B:
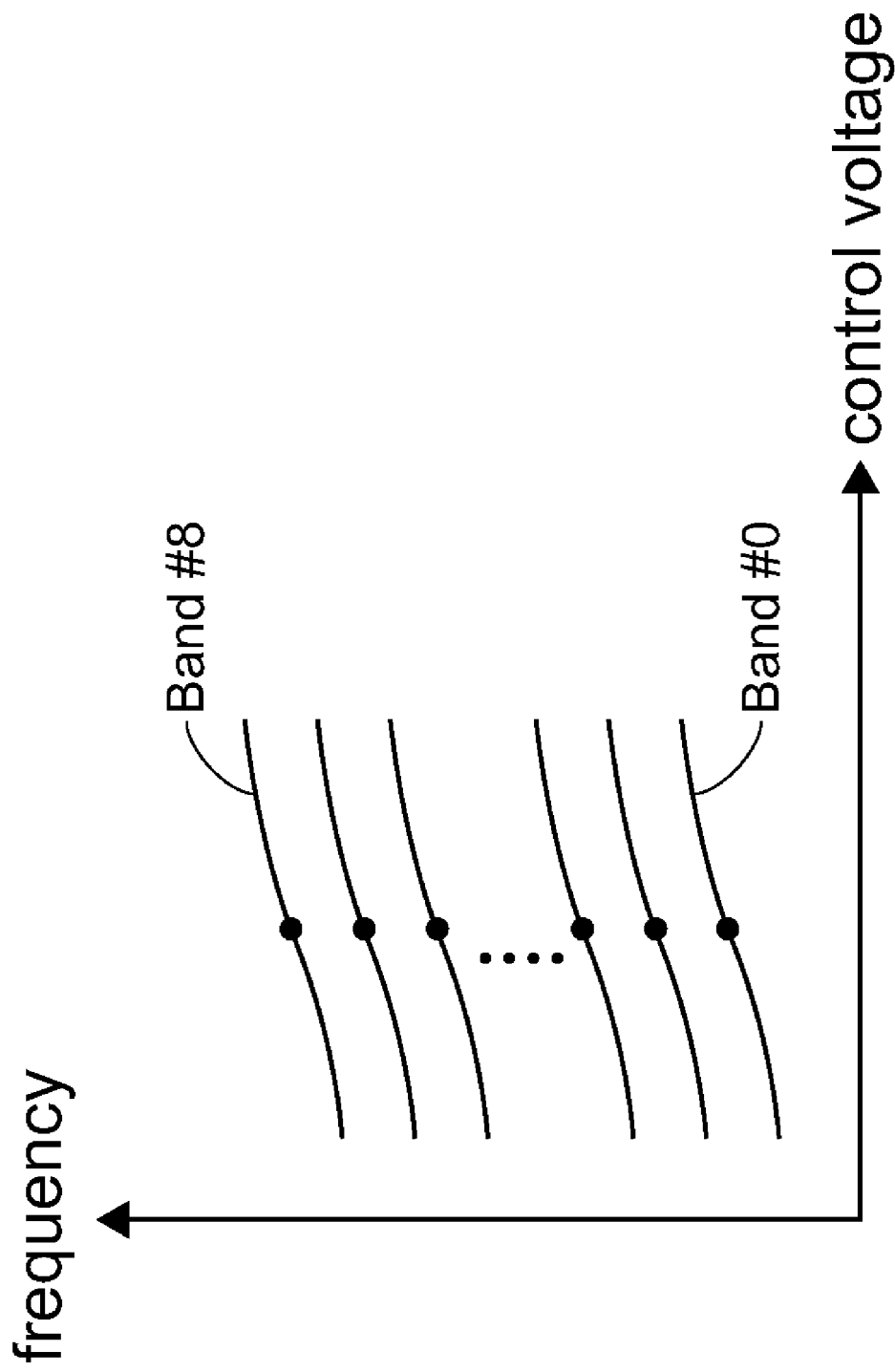
FIG. 2B is a plot illustrating multiple bands for each VCO in FIG. 2A.
Figure 3A:
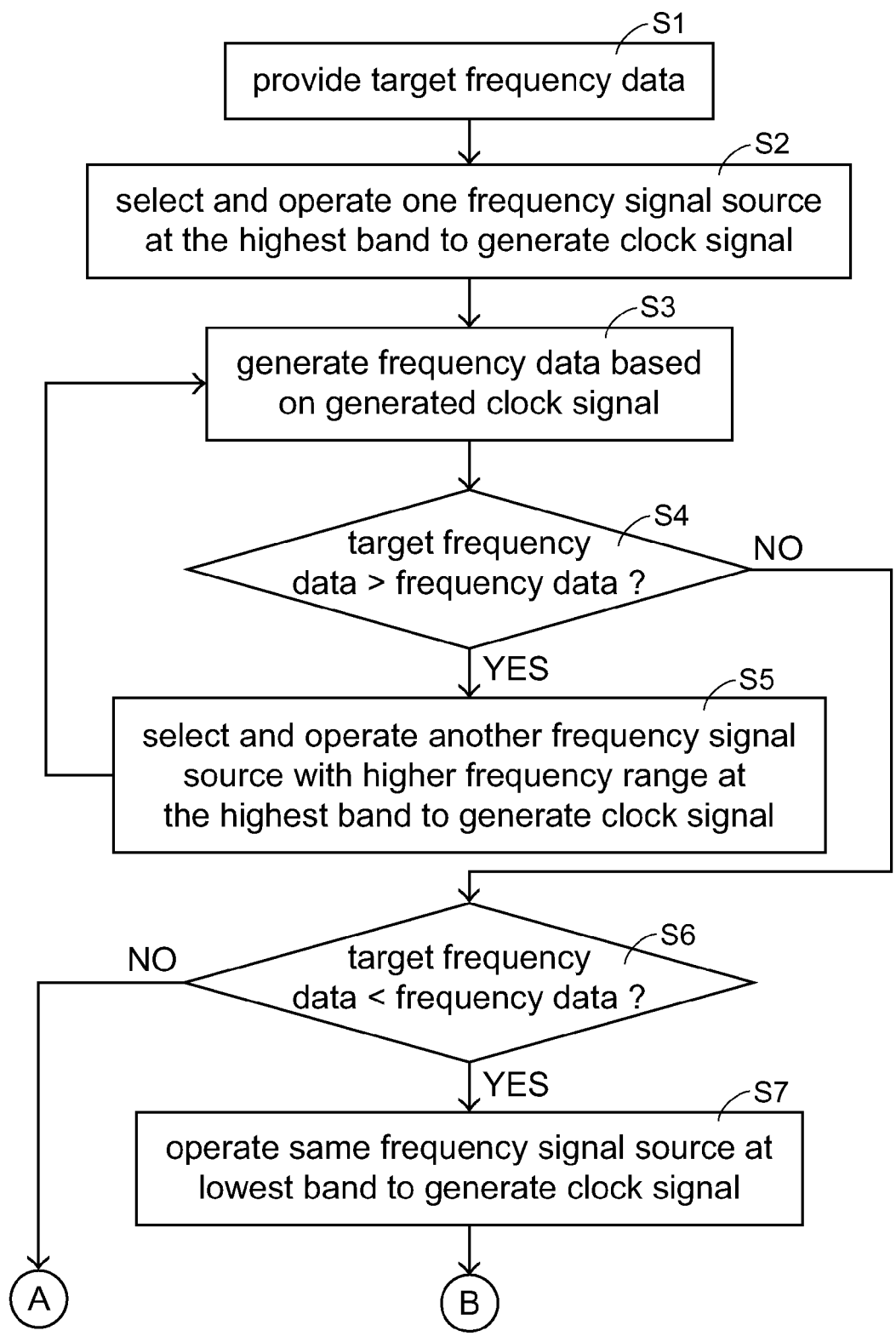
FIGS. 3A and 3B are flowcharts of a frequency switching method according to an embodiment of the present invention.
Figure 3B:
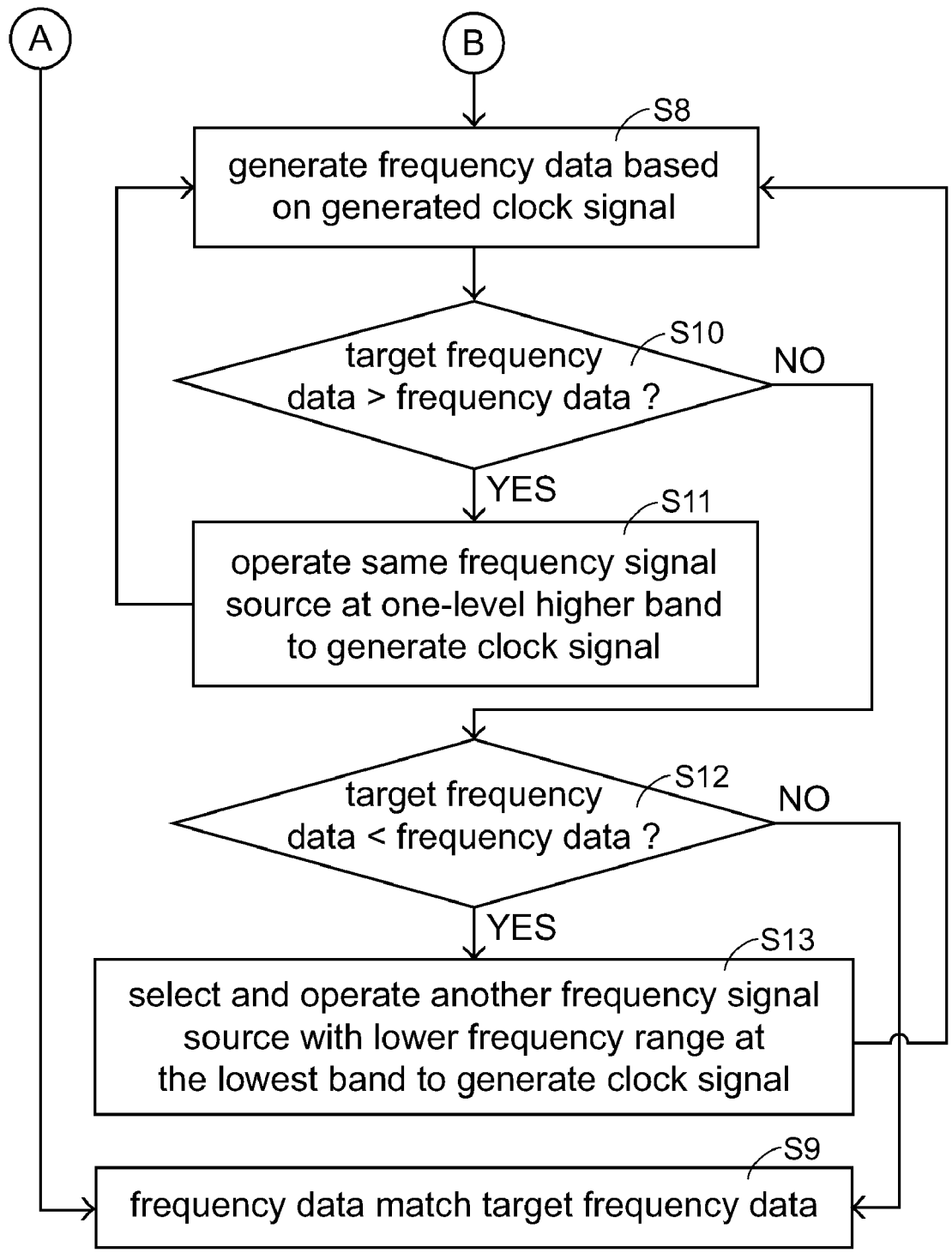
Figure 3C:
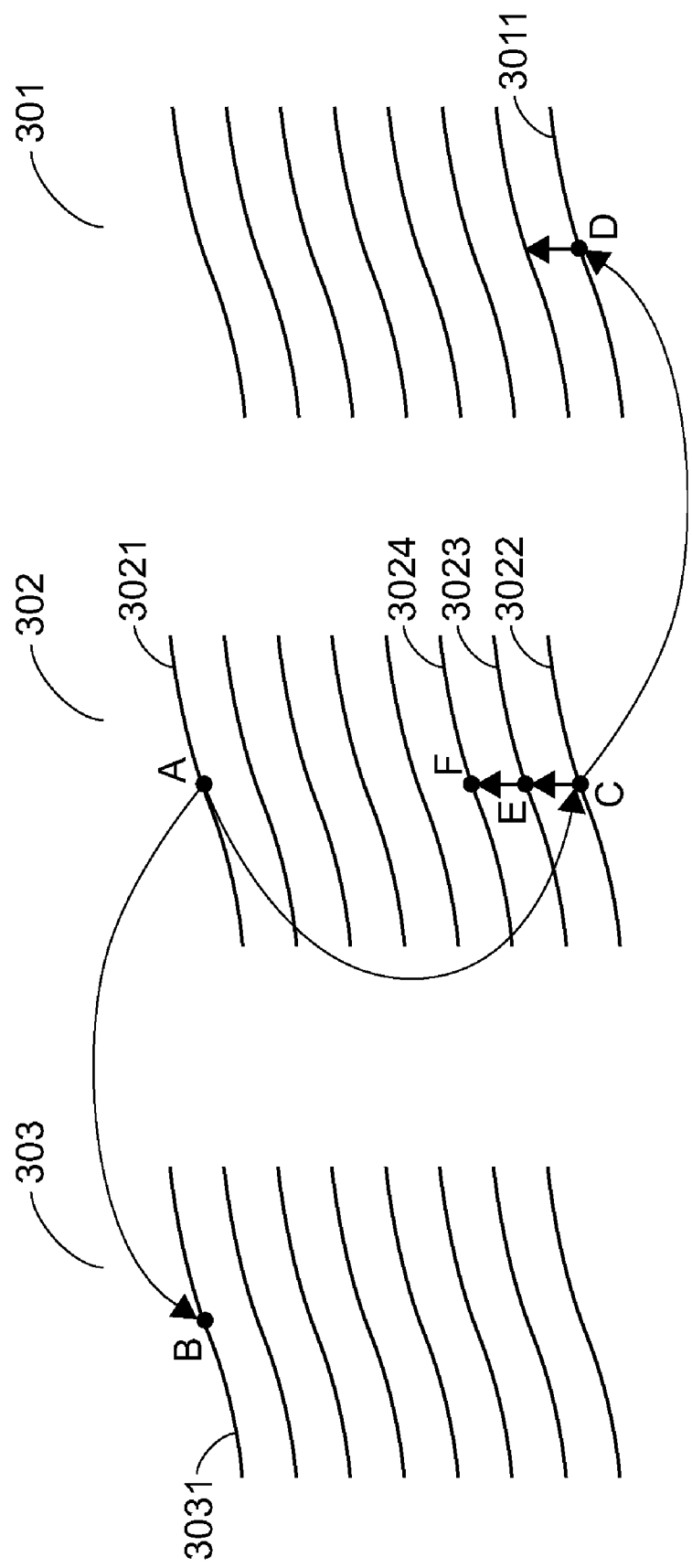
FIG. 3C is a scheme illustrating the frequency switching of FIGS. 3A and 3B.

For readily calibrating multiple voltage controlled oscillators (VCOs), a frequency switching method as illustrated in FIGS. 3A, 3B and 3C is developed according to the present invention. FIGS. 3A and 3B are conjugated flowcharts illustrating a frequency switching method for a plurality of frequency signal sources (e.g. VCOs) according to an embodiment of the present invention, wherein each frequency signal source operates at a plurality of different bands so as to cover a large frequency range. In order to generate a clock signal with a desired frequency, one of the frequency signal sources operating at an optimal band is selected.

First of all, a target frequency data, e.g. a counting value, is provided (Step S1). Meanwhile, one of the frequency signal sources is selected and operates at a specific point of the highest band thereof so as to generate a clock signal (Step S2). Based on the clock signal, a frequency data, e.g. a counting value, is generated according to transitions of the clock signal, e.g. the zero-crossing number, and compared with the target frequency data (Step S3) to determine whether the target frequency value is greater than the frequency data (Step S4). If the target frequency value is greater than the frequency data, another frequency signal source possessing a frequency range higher than and neighboring to that of the selected frequency signal source is then selected and operates at a proper point of the highest band thereof to generate another clock signal (Step S5). Then the step of generating and comparing a frequency data with the target frequency data (Step S3) is executed again. If the target frequency value is still greater than the newly generated frequency data, a further frequency signal source with an even higher frequency range is selected to generate next clock signal and then next frequency data. Repeat Steps S3~S5 till the target frequency value is not greater than the latest frequency data. Then, enter Step S6 to determine whether the target frequency value is smaller than the frequency data. If the target frequency value is smaller than the frequency data, the latest selected frequency signal source is made to operate at a specific point of the lowest band thereof so as to generate next clock signal (Step S7) and then next frequency data based on the newly generated clock signal (Step S8). Otherwise, it is determined that the frequency data has matched the target frequency data (Step S9). Therefore, none of the frequency signal source or band needs further adjustment. The calibration is thus completed.

Furthermore, if the target frequency data becomes greater than the frequency data generated in Step S8 (Step S10), the same frequency signal source selects a band one-level higher than the latest selected band to generate next clock signal (Step S11) and then next frequency data (back to Step S8). Repeat Steps S8~S11 till the target frequency data is not greater than the target frequency data. Then proceed to Step S12 to determine whether the target frequency value is smaller than the frequency data. If the target frequency value is smaller than the frequency data, a further frequency signal source possessing a frequency range lower than and neighboring to that of the latest selected frequency signal source is selected and operates at a proper point of the lowest band thereof to generate a further clock signal (Step S13) and then a further frequency data (back to Step S8). Likewise, if the target frequency value is neither greater nor smaller than the latest frequency data, it is determined that the frequency data has matched the target frequency data (Step S9).

FIG. 3C exemplifies the frequency switching based on FIGS. 3A and 3B for further understanding. In this example, a frequency signal source 302 is first selected and operates at a central point A of the highest band 3021 thereof to generate a first clock signal. According to the first clock signal, a first frequency counting value is calculated. If the first frequency counting value is smaller than a target frequency counting value, it will switch from the frequency signal source 302 to a frequency signal source 303 next to the frequency signal source 302 and possessing a higher frequency range than that of the frequency signal source 302, which operates at a central point B of the highest band 3031 thereof to generate a second clock signal. On the contrary, the second clock signal will be generated by the same frequency signal source 302 if the first frequency counting value is greater than the target frequency counting value. The frequency signal source 302 operates at a central point C of the lowest band 3022 thereof to generate the second clock signal.

Based on the second clock signal generated by the frequency signal source 302, a second frequency counting value is calculated and compared with the target frequency counting value. If the second frequency counting value is still greater than the target frequency counting value, it will switch from the frequency signal source 302 to a frequency signal source 301 next to the frequency signal source 302 and possessing a lower frequency range than that of the frequency signal source 302, which operates at a central point D of the lowest band 3011 thereof to generate a third clock signal. On the contrary, the third clock signal will be generated by the same frequency signal source 302 if the second frequency counting value is smaller than the target frequency counting value. The frequency signal source 302 operates at a central point E of a band 3023 one-level higher than the lowest band 3022 thereof to generate the third clock signal. Alternatively, it is feasible to have the frequency signal source 302 operate at a central point F of a band 3024 two-level or more higher than the lowest band 3022 to generate the third clock signal when the second frequency counting value is smaller than the target frequency counting value.

On the other hand, based on the second clock signal generated by the frequency signal source 303, a corresponding frequency counting value is calculated and compared with the target frequency counting value. If the frequency counting value is smaller than the target frequency counting value, it will switch from the frequency signal source 303 to a further frequency signal source (not shown) next to the frequency signal source 303 and possessing a higher frequency range than that of the frequency signal source 303, which operates at the highest band thereof to generate next clock signal. On the contrary, if the frequency counting value is greater than the target frequency counting value, frequency switching can be made by shifting one level or multiple levels at a time in the same frequency signal source or jumping directly to the lowest band and then rising one level or multiple levels at a time in the same frequency signal source.

The above algorithm is repetitively executed until the newly generated frequency counting value matches the target frequency counting value.

Figure 4:
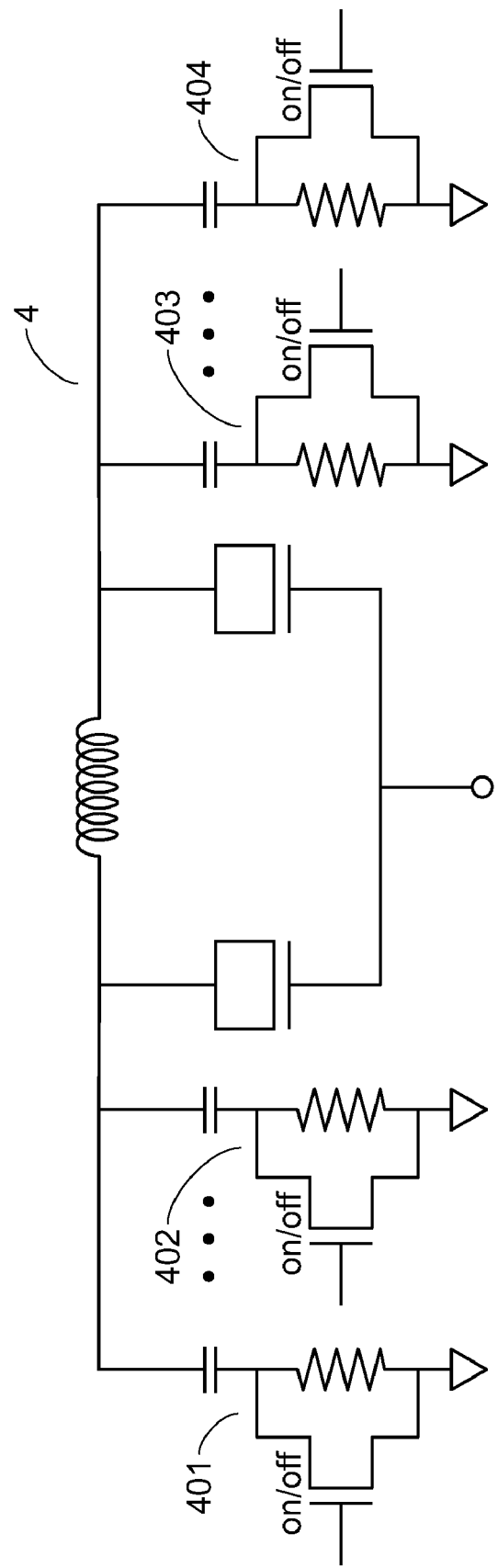
FIG. 4 is a circuit diagram illustrating a voltage controlled oscillator.

The switching operation among the bands can be implemented by a VCO 4 as shown in FIG. 4. The VCO 4 includes a plurality of controlled switches 401, 402, 403 and 404 . . . etc. By way of optionally switching the controlled switches, the number of capacitors-resistors interconnected in parallel varies so as to render the VCO 4 to operate at a specific band, thereby outputting a corresponding clock signal.

Figure 5A:
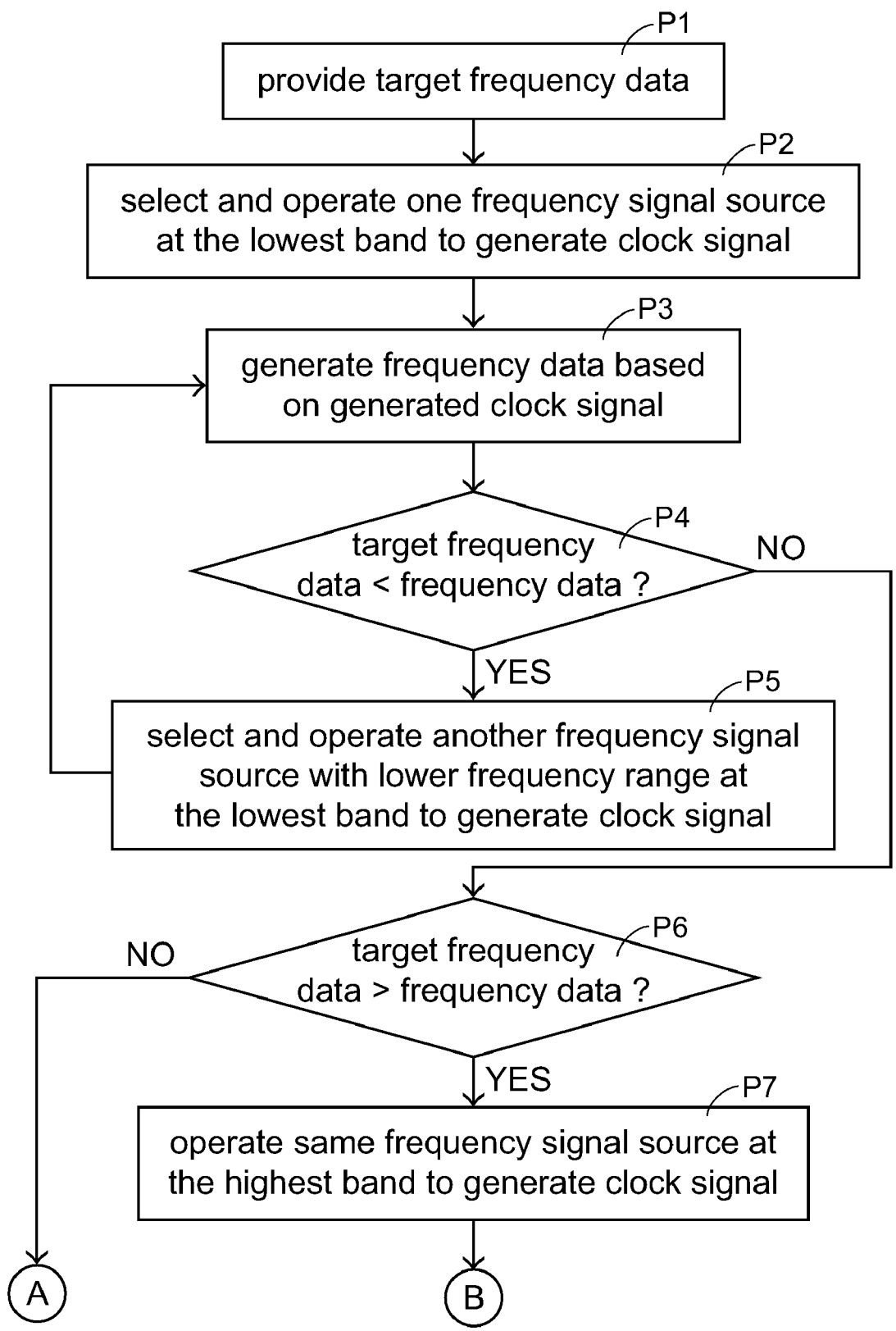
FIGS. 5A and 5B are flowcharts of a frequency switching method according to another embodiment of the present invention.
Figure 5B:
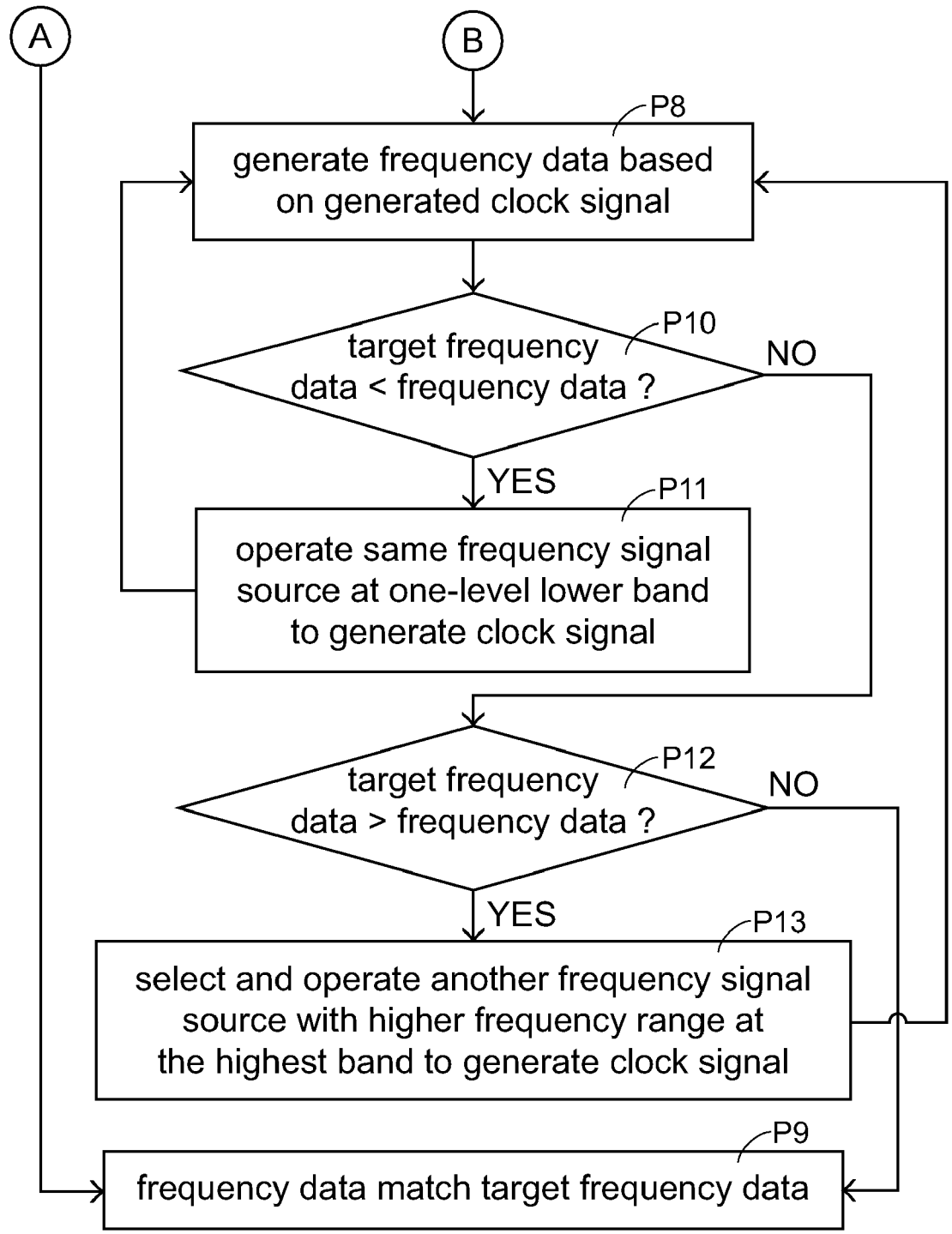

FIGS. 5A and 5B illustrating a frequency switching method according to another embodiment of the present invention. Likewise, each frequency signal source operates at a plurality of different bands so as to cover a specific frequency range.

First of all, a target frequency data, e.g. a counting value, is provided (Step P1). Meanwhile, one of the frequency signal sources is selected and operates at a specific point of the lowest band thereof so as to generate a clock signal (Step P2). Based on the clock signal, a frequency data, e.g. a counting value, is generated by calculating the fluctuation of the waveform of the clock signal, e.g. the zero-crossing number, and compared with the target frequency data (Step P3) to determine whether the target frequency value is smaller than the frequency data (Step P4). If the target frequency value is smaller than the frequency data, another frequency signal source with a frequency range lower than and neighboring to that of the selected frequency signal source, is then selected to operate at a specific point of the lowest band thereof to generate another clock signal (Step P5). Then the step of generating and comparing a frequency data with the target frequency data (Step P3) is executed again. If the target frequency value is still smaller than the newly generated frequency data, a further frequency signal source with an even lower frequency range is selected to generate next clock signal and then next frequency data. Repeat Steps P3~P5 till the target frequency value is not smaller than the latest frequency data. Then proceed to Step P6 to determine whether the target frequency value is greater than the frequency data. If the target frequency value is greater than the frequency data, the latest selected frequency signal source is made to operate at a specific point of the highest band thereof so as to generate next clock signal (Step P7) and then next frequency data based on the newly generated clock signal (Step P8). Otherwise, it is determined that the frequency data has matched the target frequency data (Step P9). Therefore, none of the frequency signal source or band needs further adjustment. The calibration is thus completed.

Furthermore, if the target frequency data becomes smaller than the frequency data generated in Step P8 (Step P10), the same frequency signal source is selected but operates at a band one-level lower than the latest selected band to generate next clock signal (Step P11) and then next frequency data (back to Step P8). Steps P8~P11 are repeated until the target frequency data is not smaller than the target frequency data. Then, proceed to Step P12 to determine whether the target frequency value is greater than the frequency data. If the target frequency value is greater than the frequency data, a further frequency signal source with a frequency range higher than and neighboring to that of the latest selected frequency signal source, is selected and operates at a specific point of the highest band thereof to generate a further clock signal (Step P13) and then a further frequency data (back to Step P8). Likewise, Step P9 determines that the frequency data has matched the target frequency data.

Figure 5C:
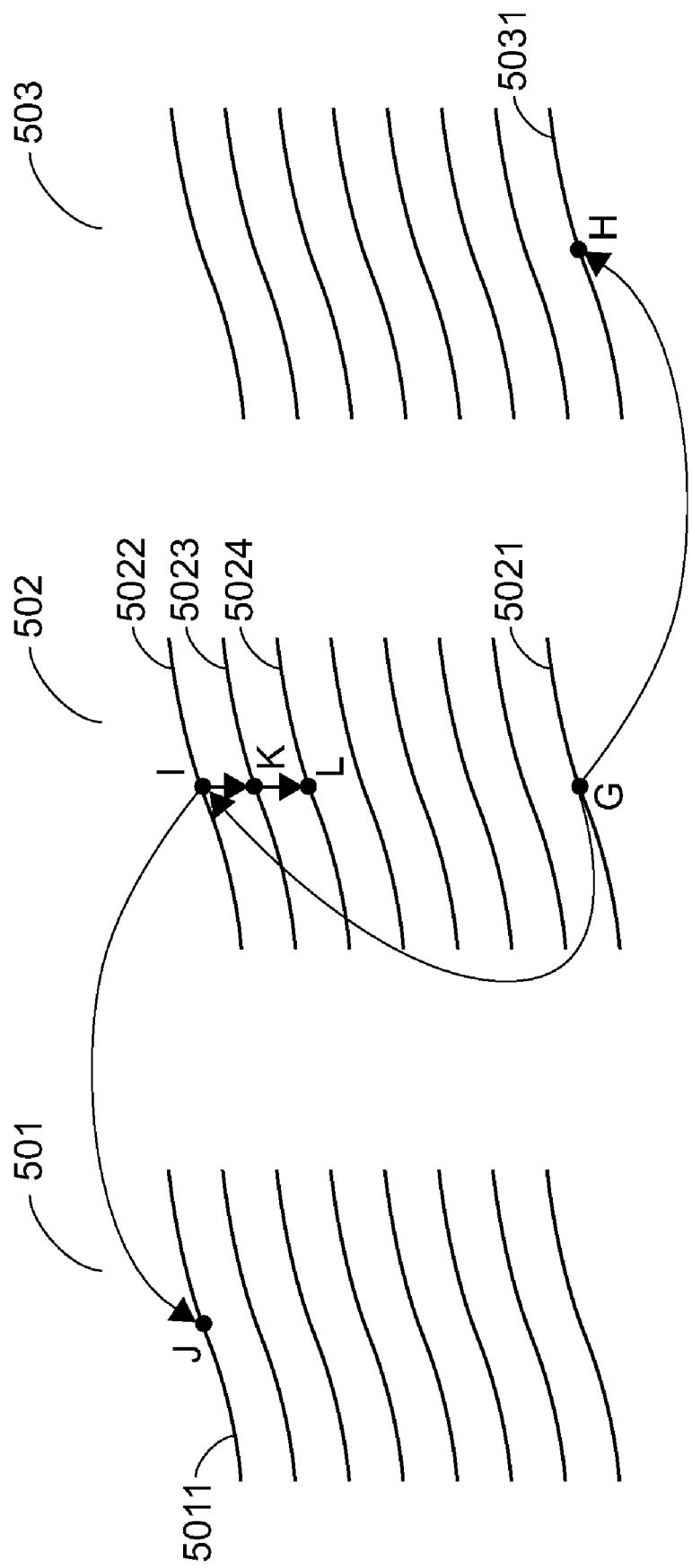
FIG. 5C is a scheme illustrating the frequency switching of FIGS. 5A and 5B.

FIG. 5C exemplifies the frequency switching based on FIGS. 5A and 5B for further understanding. In this example, a frequency signal source 502 is first selected and operates at a central point G of the highest band 5021 thereof to generate a first clock signal. According to the first clock signal, a first frequency counting value is calculated. If the first frequency counting value is greater than a target frequency counting value, switch from the frequency signal source 502 to a frequency signal source 503 next to the frequency signal source 502, with a lower frequency range than that of the frequency signal source 502, while operating at a central point H of the lowest band 5031 thereof to generate a second clock signal. On the contrary, the second clock signal will be generated by the same frequency signal source 502 if the first frequency counting value is smaller than the target frequency counting value. The frequency signal source 502 operates at a central point I of the highest band 5022 thereof to generate the second clock signal.

Based on the second clock signal generated by the frequency signal source 502, a second frequency counting value is calculated and compared with the target frequency counting value. If the second frequency counting value is still smaller than the target frequency counting value, switch from the frequency signal source 502 to a frequency signal source 501 next to the frequency signal source 502, with a higher frequency range than that of the frequency signal source 502, while operating at a central point J of the highest band 5011 thereof to generate a third clock signal. On the contrary, the third clock signal will be generated by the same frequency signal source 502 if the second frequency counting value is greater than the target frequency counting value. The frequency signal source 502 operates at a central point K of a band 5023 one-level lower than the highest band 5022 thereof to generate the third clock signal. Alternatively, it is feasible to have the frequency signal source 502 operate at a central point L of a band 5024 two-level or more lower than the highest band 5022, each time, to generate the third clock signal when the second frequency counting value is greater than the target frequency counting value.

On the other hand, based on the second clock signal generated by the frequency signal source 503, a corresponding frequency counting value is calculated and compared with the target frequency counting value. If the frequency counting value is greater than the target frequency counting value, switch from the frequency signal source 503 to a further frequency signal source (not shown) next to the frequency signal source 503, with a lower frequency range than that of the frequency signal source 503, while operating at the lowest band thereof to generate next clock signal. On the contrary, if the frequency counting value is smaller than the target frequency counting value, frequency switching can be made by rising one level or multiple levels at a time in the same frequency signal source or directly jumping to the highest band and then lowering one level or multiple levels at a time in the same frequency signal source.

The above algorithm is repetitively executed until the newly generated frequency counting value matches the target frequency counting value.

According to the above-mentioned frequency switching method, it is possible that the comparison result of the frequency data with the target frequency data results in repetitive toggling between two adjacent bands. Therefore, a threshold is preferably preset to avoid undesirable toggling. That is, when toggling times exceed the threshold, it is determined that the target frequency data is located between two adjacent bands. Thus the frequency switching is halted, and instead, the band resulting in the frequency data closer to the target frequency data is selected as the final decision for calibration.

The frequency switching method disclosed by the present invention can perform VCO calibration efficiently.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures. For example, the alphabetic references of steps in claims, e.g. a), b), c), d) and e), are used for facilitating descriptions and understanding of claims rather than intending to limit the sequence of the steps.

What is claimed is:

1. A frequency switching method for switching among a plurality of frequency signal sources, each frequency signal source providing a predetermined frequency range with multiple bands, the method comprising steps of:
   a) providing a target frequency data;
   b) selecting a first frequency signal source among the frequency signal sources operating to generate a first clock signal;
   c) generating a first frequency data according to the first clock signal to compare with the target frequency data;
   d) operating the first frequency signal source at the lowest band to generate a second clock signal when the target frequency data is smaller than the first frequency data; and
   e) switching to a second frequency signal source among the frequency signal sources when the target frequency data is greater than the first frequency data, wherein the second frequency signal source possesses a frequency range higher than that of the first frequency signal source and operating at the highest band thereof to generate the second clock signal.

2. The method according to claim 1 wherein the first frequency signal source operates at the highest band thereof to generate the first clock signal.

3. The method according to claim 1 further comprising after the step d) steps of:
   generating a second frequency data according to the second clock signal and comparing the second frequency data with the target frequency data;
   operating the first frequency signal source at a band at least one level higher than the lowest band thereof to generate a third clock signal when the target frequency data is greater than the second frequency data; and
   switching to a third frequency signal source among the frequency signal sources when the target frequency data is smaller than the second frequency data, wherein the third frequency signal source possesses a frequency range lower than that of the first frequency signal source and operates at the lowest band thereof to generate the third clock signal.

4. The method according to claim 3 wherein the target frequency data, the first frequency data and the second frequency data are frequency counting values.

5. The method according to claim 4 wherein the first frequency data and the second frequency data are obtained by calculating the transitions of the first clock signal and the second clock signal, respectively.

6. The method according to claim 3 wherein the third frequency signal source possesses a frequency range lower than and neighboring to that of the first frequency signal source.

7. The method according to claim 1 wherein the second frequency signal source possesses a frequency range higher than and neighboring to that of the first frequency signal source.

8. The method according to claim 1 further comprising after the step e) of steps of:
   generating a second frequency data according to the second clock signal, and comparing the second frequency data with the target frequency data;
   operating the second frequency signal source at a band at least one level lower than the highest band thereof to generate a third clock signal when the target frequency data is smaller than the second frequency data; and
   switching to a third frequency signal source among the frequency signal sources when the target frequency data is greater than the second frequency data, wherein the third frequency signal source possesses a frequency range higher than that of the second frequency signal source and operates at the highest band thereof, to generate the third clock signal.

9. The method according to claim 1 wherein the plurality of frequency signal sources are implemented with a plurality of voltage controlled oscillators, respectively.

10. A frequency switching method for switching among a plurality of frequency signal sources, each frequency signal source providing a specific frequency range with multiple bands, the method comprising steps of:
    a) providing a target frequency data;
    b) selecting a first frequency signal source among the frequency signal sources operating to generate a first clock signal;
    c) generating a first frequency data according to the first clock signal to compare with the target frequency data;
    d) operating the first frequency signal source at the highest band thereof to generate a second clock signal when the target frequency data is greater than the first frequency data; and
    e) switching to a second frequency signal source among the frequency signal sources when the target frequency data is smaller than the first frequency data, wherein the second frequency signal source possesses a frequency range lower than that of the first frequency signal source and operates at the lowest band thereof, to generate the second clock signal.

11. The method according to claim 10 wherein the first frequency signal source operates at the lowest band thereof to generate the first clock signal.

12. The method according to claim 10 further comprising after the step d) steps of:
    generating a second frequency data according to the second clock signal and comparing the second frequency data with the target frequency data;
    operating the first frequency signal source to at least one level lower than the highest band thereof to generate a third clock signal when the target frequency data is smaller than the second frequency data; and
    switching to a third frequency signal source among the frequency signal sources when the target frequency data is greater than the second frequency data, wherein the third frequency signal source possesses a frequency range higher than that of the first frequency signal source and operates at the highest band thereof, to generate the third clock signal.

13. The method according to claim 12 wherein the target frequency data, the first frequency data and the second frequency data are frequency counting values.

14. The method according to claim 13 wherein the first frequency data and the second frequency data are obtained by calculating the transitions of the first clock signal and the second clock signal, respectively.

15. The method according to claim 12 wherein the third frequency signal source possesses a frequency range higher than that of the first frequency signal source.

16. The method according to claim 10 wherein the second frequency signal source possesses a frequency range lower than that of the first frequency signal source.

17. The method according to claim 10 further comprising after the step e) steps of:

generating a second frequency data according to the second clock signal and comparing the second frequency data with the target frequency data;

operating the second frequency signal source at a band at least one level higher than the lowest band thereof to generate a third clock signal when the target frequency data is smaller than the second frequency data; and switching to a third frequency signal source among the frequency signal sources when the target frequency data is smaller than the second frequency data, wherein the third frequency signal source possesses a frequency range lower than that of the second frequency signal source and operates at the lowest band thereof, to generate the third clock signal.

18. The method according to claim 10 wherein the plurality of frequency signal sources are implemented with a plurality of voltage controlled oscillators, respectively.

* * * * *